US009699925B2

United States Patent
Yeh et al.

(10) Patent No.: US 9,699,925 B2
(45) Date of Patent: Jul. 4, 2017

(54) ASSEMBLY STRUCTURE AND ELECTRONIC DEVICE THEREOF

(71) Applicant: Wistron Corporation, New Taipei (TW)

(72) Inventors: Ping-Sheng Yeh, New Taipei (TW); Cheng-Tang Chang, New Taipei (TW); Shin-Yi Hsieh, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 0 days.

(21) Appl. No.: 15/134,680

(22) Filed: Apr. 21, 2016

(65) Prior Publication Data

US 2017/0006719 A1 Jan. 5, 2017

(30) Foreign Application Priority Data

Jul. 3, 2015 (TW) .............................. 104121644 A (51) Int. Cl.
*H05K 5/02* (2006.01)
*G06F 1/16* (2006.01)
*G06F 1/18* (2006.01)

(52) U.S. Cl.
CPC ......... *H05K 5/0221* (2013.01); *G06F 1/1637* (2013.01); *G06F 1/18* (2013.01)

(58) Field of Classification Search
CPC ............................ H05K 5/0221; G06F 1/1637
See application file for complete search history.

(56) References Cited

U.S. PATENT DOCUMENTS

| | | | | |
|---|---|---|---|---|
| 6,826,863 B1* | 12/2004 | Goodfellow | .......... | G06F 1/1607 248/918 |
| 7,175,242 B2* | 2/2007 | Lee | .......... | A47F 3/005 312/265.5 |
| 7,236,357 B2* | 6/2007 | Chen | .......... | G06F 1/1616 312/223.1 |
| 8,693,190 B2 | 4/2014 | Chang | | |
| 9,063,362 B2* | 6/2015 | Kim | .......... | G02F 1/133308 |
| 2008/0247127 A1* | 10/2008 | Finnegan | .......... | G06F 1/1607 361/679.02 |
| 2011/0269004 A1* | 11/2011 | Chang | .......... | H01M 2/1066 429/97 |

* cited by examiner

*Primary Examiner* — Adrian S Wilson
(74) *Attorney, Agent, or Firm* — Muncy, Geissler, Olds & Lowe, P.C.

(57) ABSTRACT

An assembly structure has a fixing portion and a locking portion. The fixing portion is in a first housing and has a fixing part and a stopping portion. The locking portion is in a second housing and has a moving direction relative to the second housing. The locking portion has a locking part and a hook portion. The assembly structure has a fixing state and a stopping state; in the fixing state, the locking part is connected to the fixing part. The locking part moves to the stopping state along the moving direction for switching the assembly structure to the stopping state. In the stopping state, the hook portion leans against the stopping portion, and the locking part and the fixing part are separated for allowing the fixing portion to be separated from the locking portion along an assembly direction, the assembly direction and the moving direction being different.

20 Claims, 10 Drawing Sheets

ASSEMBLY STRUCTURE AND ELECTRONIC DEVICE THEREOF

BACKGROUND OF THE INVENTION

1. Field of the Invention

The present invention is related to an assembly structure and electronic device thereof. In addition, the assembly structure achieves the purpose of detaching in two steps.

2. Description of the Related Art

For proving an electronic device user can change the inner electronic element, the housing of the electronic device is detachable, and for avoiding detaching whole housing, the designer proves a rear cover for user detaching.

The traditional rear cover is fixed by a screw, and now, the rear cover is fixed by a quick release structure for convenient. However the traditional quick release structure is difficult to operate, the user should push the quick release structure in horizontal direction, and pushes the rear cover in the vertical direction. It means that the user needs to press the quick release structure for pushing up the rear cover in the same time, the user needs to force in two directions. The operation is not smoothly, the user even can't detach the rear cover successfully.

SUMMARY OF THE INVENTION

The present invention solves the problem which is providing a convenient detachable structure.

For solving the problem said above, the present invention provides an assembly structure for installing a first housing and a second housing. The assembly structure comprises a fixing portion and a locking portion. The fixing portion is set in a first housing, the fixing portion comprises a fixing part and a stopping portion, the distance between the fixing part and the stopping portion is a fixing length. The locking portion is set in a second housing, the locking portion has a moving direction relative to the second housing. The locking portion comprises a locking part and a hook portion, the distance between the hook portion and the locking part is a locking length, and the fixing length is greater than the locking length. Wherein, the assembly structure comprises a fixing state and a stopping state; in the fixing state, the locking part is connected to the fixing part fix, and the locking portion moving along the moving direction to allow the assembly structure to be the stopping state; in the stopping state, the hook portion leans against the stopping portion, and the locking part and the fixing part are separated such that the fixing portion can be separated from the locking portion along an assembly direction, the assembly direction and the moving direction not being parallel.

The present invention further comprises an electronic device, sets the above-mentioned assembly structure.

As described above, the assembly structure of the present invention comprises the following advantages: When the hook portion contacts the stopping portion, the locking part remains in the locked state; when the locking part and the fixing part are separated, the fixing part can be separated from the locking part along the assembly direction.

BRIEF DESCRIPTION OF THE DRAWINGS

These and other objects and advantages of the present invention will become apparent from the following description of the accompanying drawings, which disclose several embodiments of the present invention. It is to be understood that the drawings are to be used for purposes of illustration only, and not as a definition of the invention.

In the drawings, wherein similar reference numerals denote similar elements throughout the several views.

DETAILED DESCRIPTION OF THE PREFERRED EMBODIMENT

To facilitate understanding and to clarify the object, characteristics, and advantages of the present disclosure, the following three specific embodiments and figures illustrating the present disclosure are presented as a detailed description.

Figure 1:
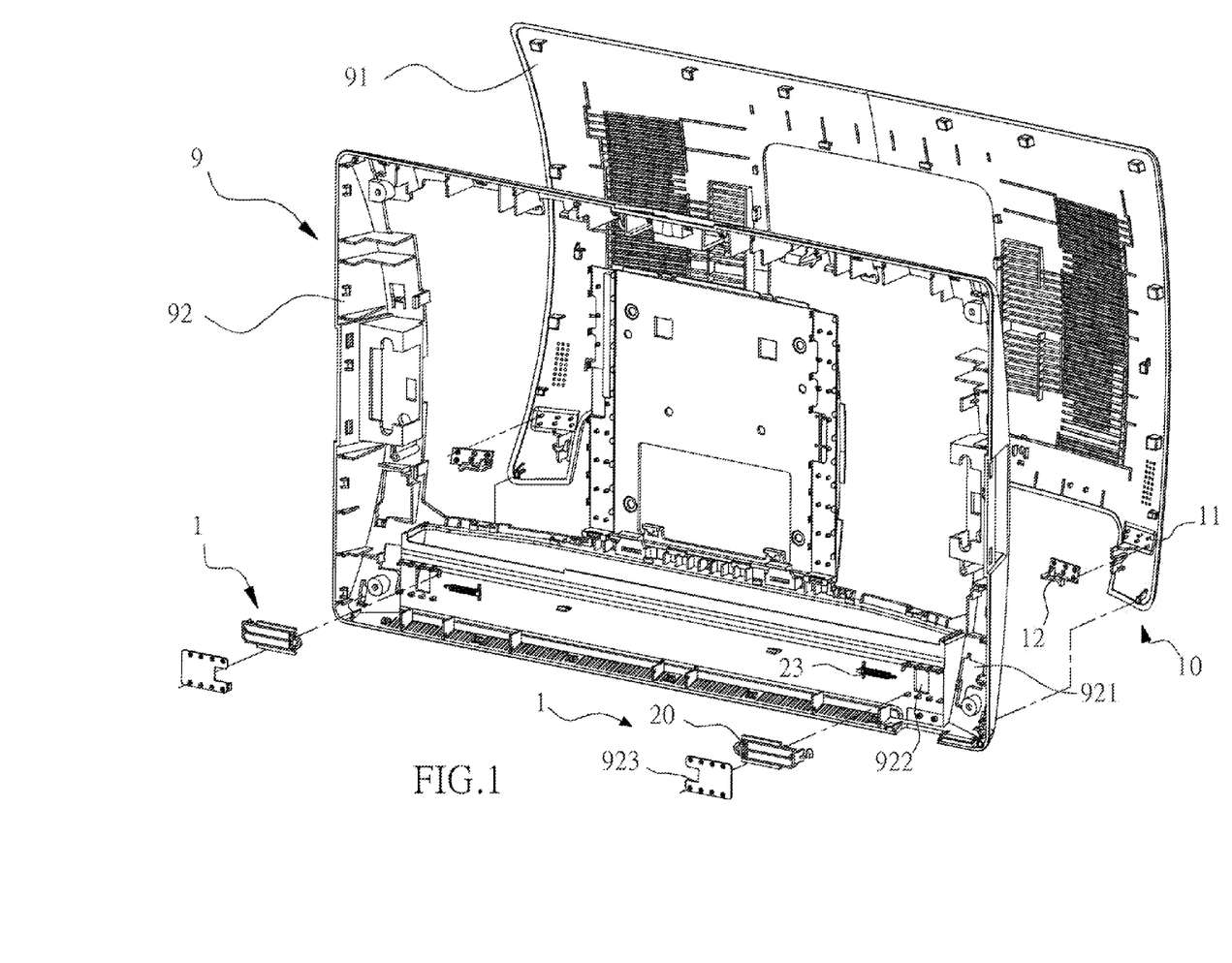
FIG. 1 is an exploded perspective view of the electronic device of present invention.

As shown in FIG. 1, the present invention provides an assembly structure 1 applied on an electronic device 9. For clarity, only the components related to the electronic device 9 and the assembly structure of the present invention 1 are shown. The electronic device 9 comprises a first housing 91 and a second housing 92. In one embodiment of the present invention, the first housing 91 is a removable rear cover and the second housing 92 is a housing for receiving an electronic element (not shown). The second housing 92 comprises an installation hole 921, an operating hole 922 and an installation cover 923 for fixing the assembly structure 1. The details of the relationship are described below.

The assembly structure 1 comprises a fixing portion 10 and a locking portion 20; the fixing portion 10 is disposed in the first housing 91 and the locking portion 20 is disposed in a second housing 92. The fixing portion 10 comprises a fixing part 11 and a stopping portion 12. As shown in FIG. 1, in one embodiment of the present invention, the fixing part 11 and the stopping portion 12 are disposed separately in the first housing 91, and the fixing part 11 and the first housing 91 are formed simultaneously.

The stopping portion 12 is an additional component fixed on the first housing 91, and the functions of the fixing part 11 and the stopping portion are related to each other. Therefore, the dispositions of the fixing part 11 and the stopping portion 12 in the first housing are not limited by the above description.

Figure 2:
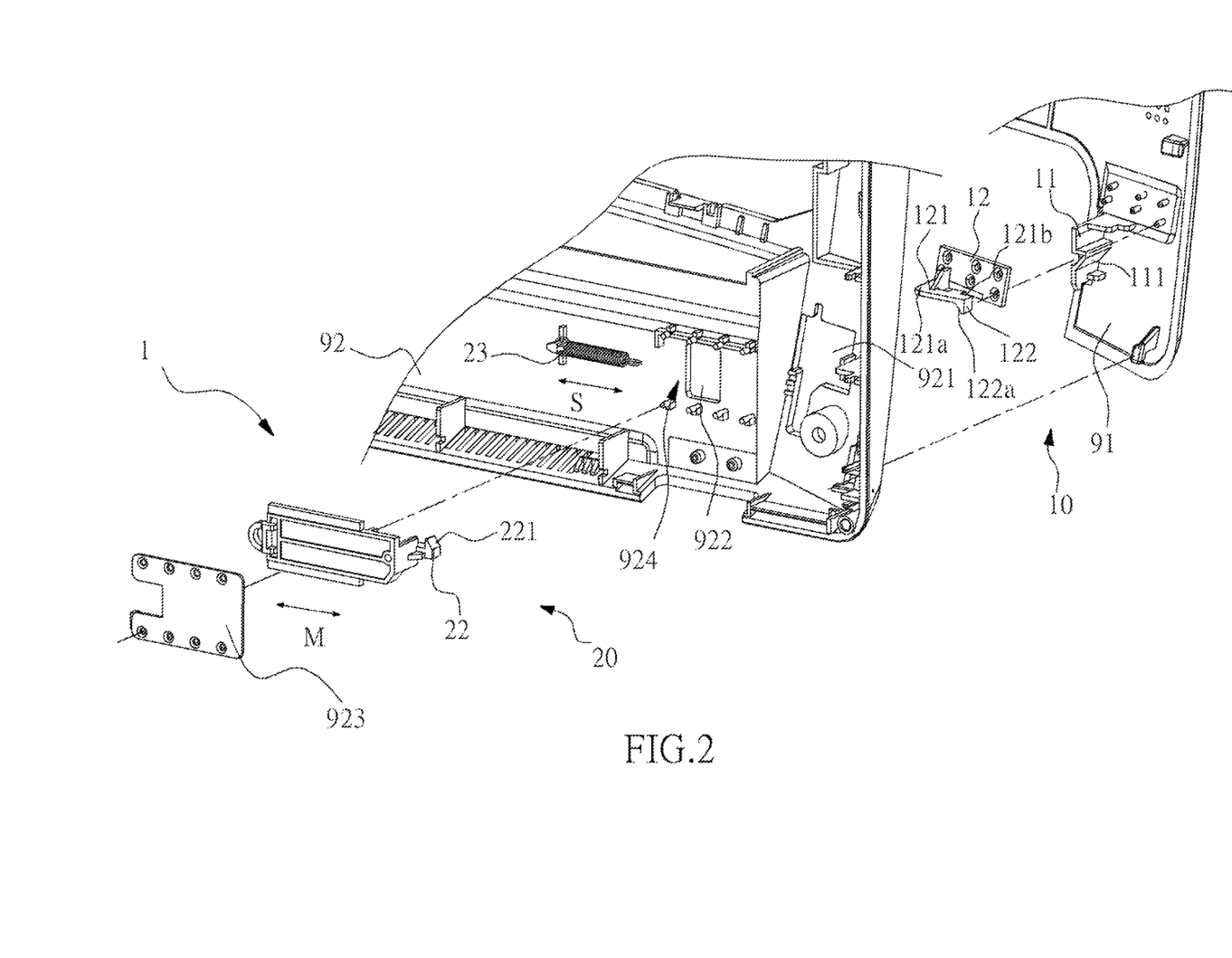
FIG. 2 is an exploded perspective view of the assembly structure of present invention.

As shown in FIG. 2, the fixing part 11 comprises a fixing slope 111. The stopping portion is formed from a stopping arm 121 and a stopping latch 122. The stopping arm 121 comprises a fixing end 121a and a free end 121b; the fixing end 121 is fixed on the first housing 91, and the stopping latch 122 is disposed on the free end 121b. The stopping latch 122 extends vertically to the stopping arm 121, and the stopping latch 122 comprises a second inclined plane 122a. The length between the fixing part 11 and the stopping portion 12 (stopping latch 122) is a fixing length L1 (shown in FIG. 9).

Figure 3:
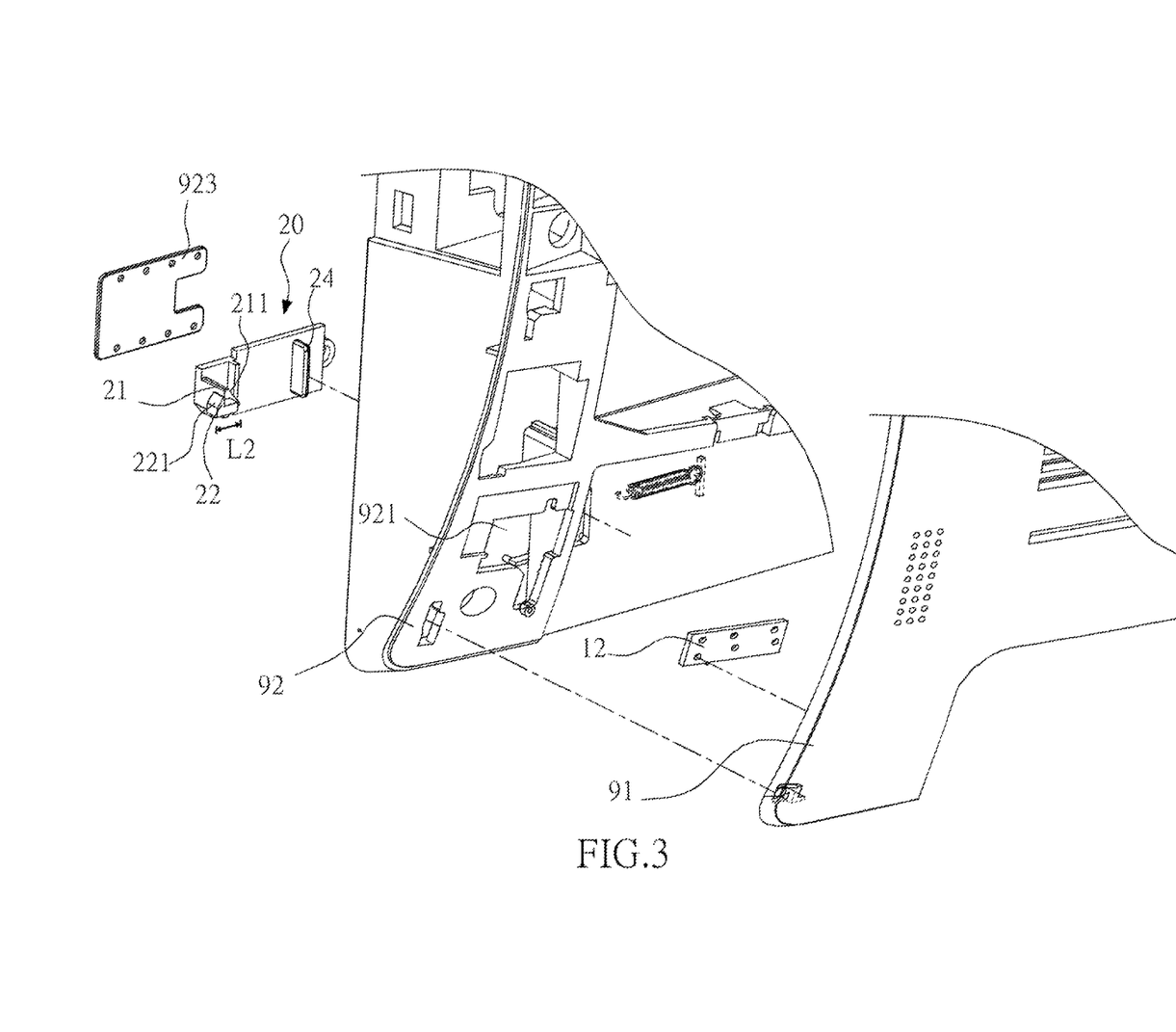
FIG. 3 is an exploded perspective view of the assembly structure of present invention.

As shown in FIG. 2 and FIG. 3, the locking portion 20 comprises a locking part 21, a hook portion 22, an elastic body 23 and a toggle portion 24; the locking part 21, the hook portion 22 and the toggle portion 24 are formed from a plastic part and formed on a same face. In one embodiment of the present invention, the elastic body 23 is a drag spring. The locking part 21 comprises a lock slope 211. The hook portion 22 has a first inclined plane 221. The length between the locking part 21 and the hook portion 22 is a locking length L2.

Figure 4:
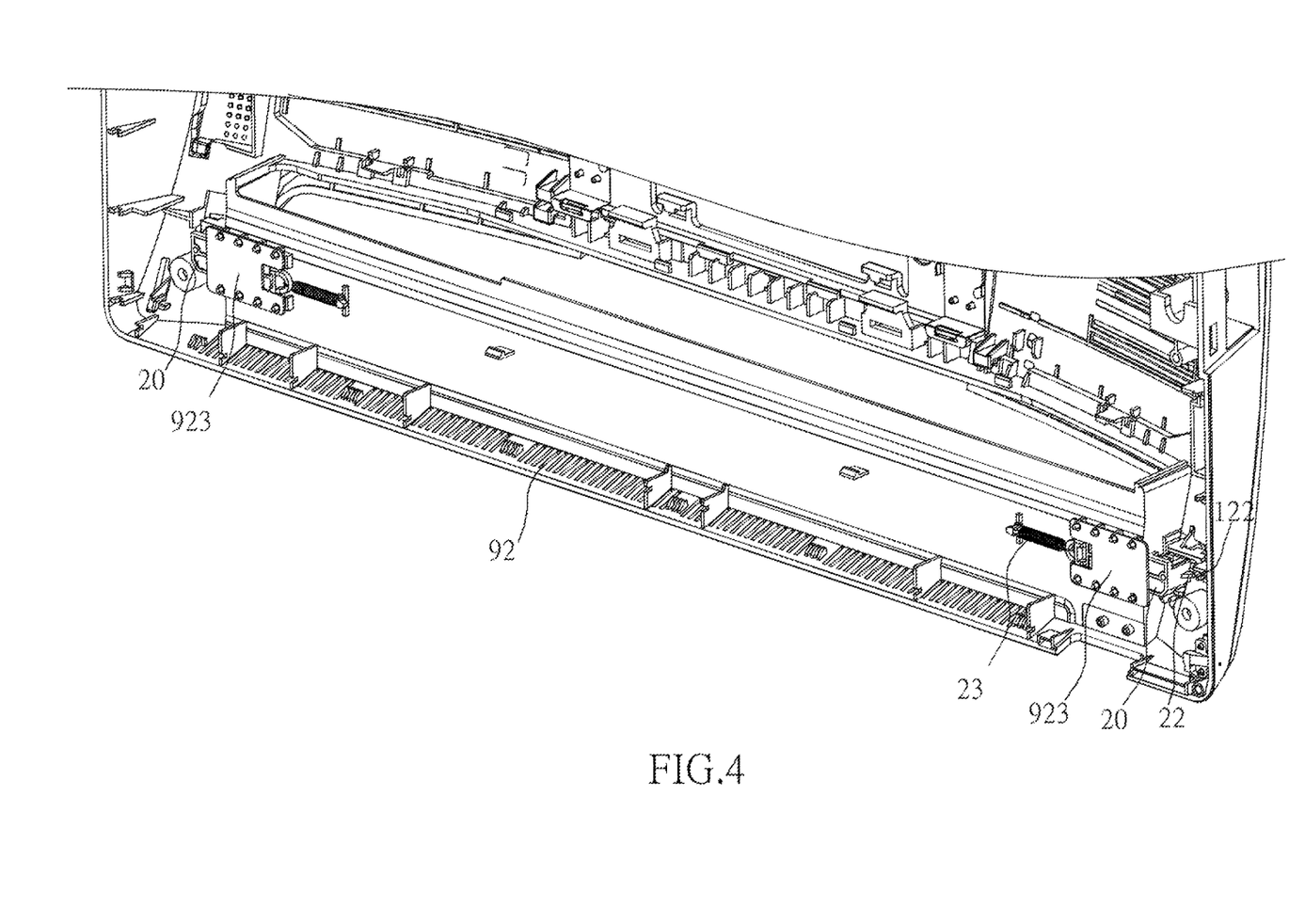
FIG. 4 is a composing diagram of the assembly structure of present invention.
Figure 5:
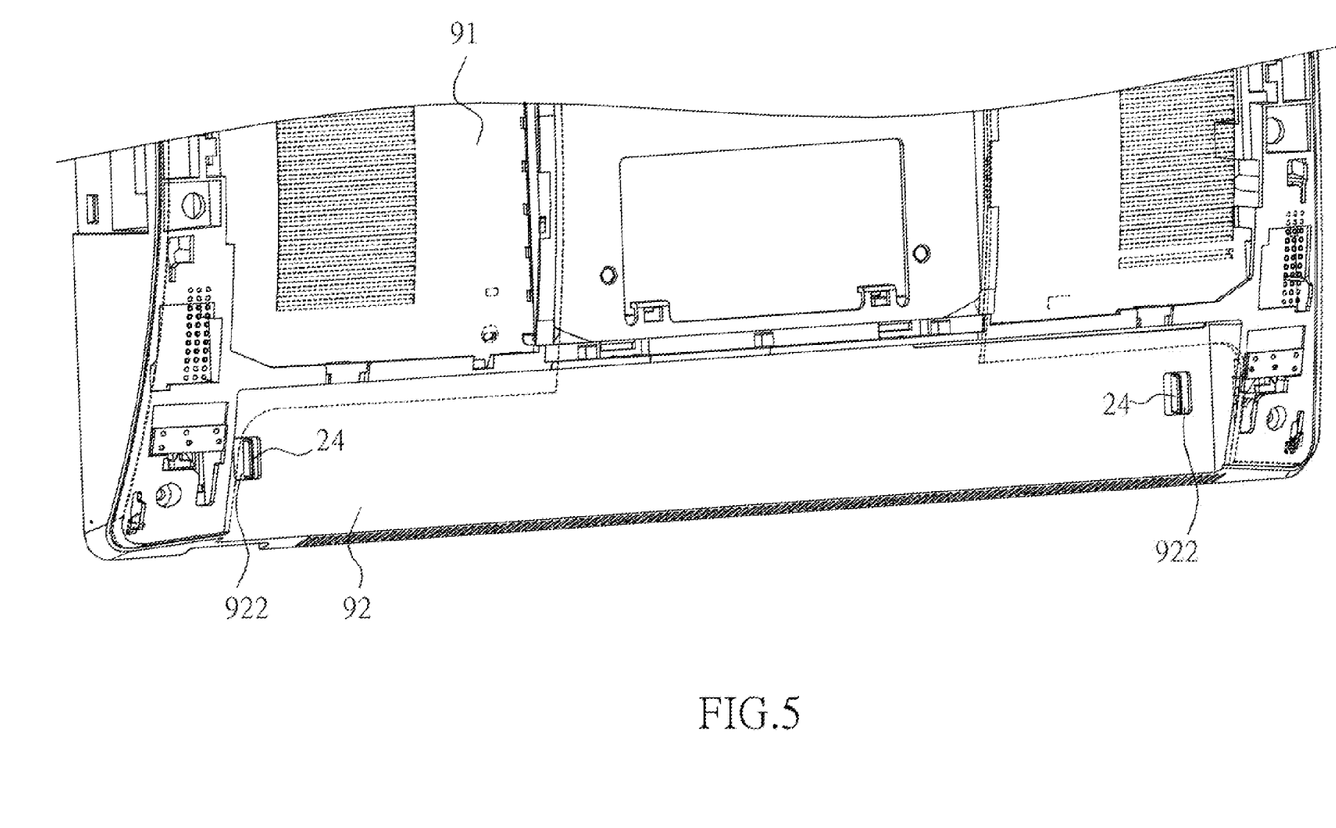
FIG. 5 is a composing diagram of the assembly structure of present invention.

As shown in FIG. 4 and FIG. 5, the locking portion 20 is disposed in a second housing 92. The second housing 92 forms a capacity space 924 through an installation cover 923, and therefore the locking portion 20 is disposed stably in the second housing 92. The end of the elastic body 23 connects to the locking part 21, the hook portion 22 and the toggle portion 24. The other end of the elastic body 23 is fixed to the second housing 92. The toggle portion 24 protrudes through the installation hole 921 of the second housing 92. The locking portion 20 (locking part 21, hook portion 22 and toggle portion 24) comprises a moving direction M relative to the second housing 92, and the moving direction M is substantially parallel to a stretch direction S of the elastic body 23.

According the mutual relationship between the fixing portion 10 and the locking portion 20, the assembly structure 1 comprises a fixing state, a stopping state, a separating state and an installation state, as explained below.

Figure 6:
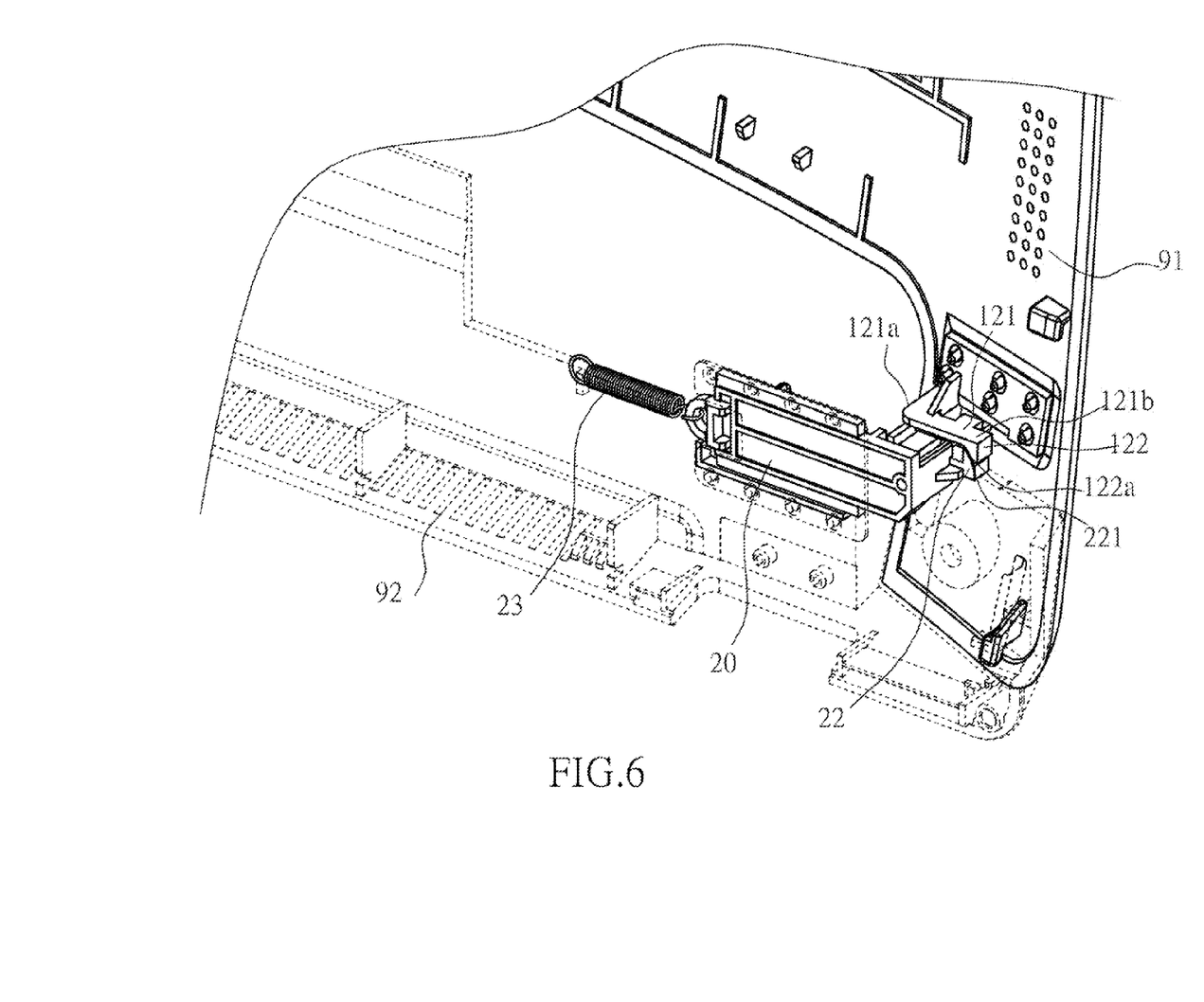
FIG. 6 is a composing diagram of the assembly structure of present invention in fixing state.

Please refer to FIG. 2, FIG. 3, FIG. 4, FIG. 5 and FIG. 6. FIG. 6 shows the assembly structure of the present invention in the fixed state. The fixing part 11 and the stopping portion 12 are disposed through the installation hole 921, and the fixing part 11 and locking part 21 are fixed to each other. The fixing slope 111 and the lock slope 211 are parallel. At this time, the hook portion 22 is not in contact with the lock latch 122.

Figure 7:
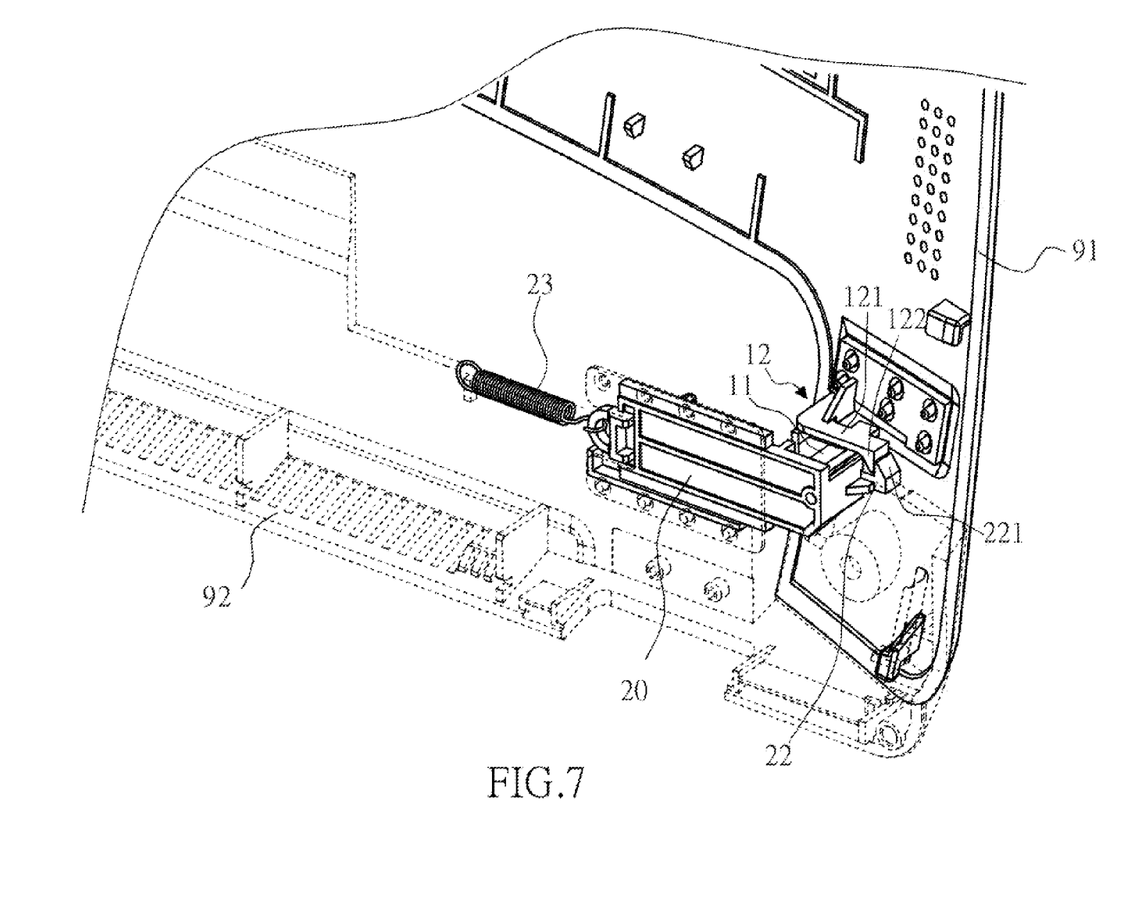
FIG. 7 is a composing diagram of the assembly structure of present invention in stopping state.

Please refer to FIG. 2, FIG. 3 and FIG. 7. FIG. 7 shows the assembly structure of the present invention in the stopping state. When the user pushes the toggle portion 24, the locking portion 20 moves along the moving direction M, and the assembly structure 1 switches from the fixed state into the stopping state. In the stopping state, the hook portion 22 leans against an end surface of the lock latch 122 away from the fixing portion 10. Because the fixing length L1 is greater than the locking length L2, the fixing part 11 and the locking part 21 are separated in the stopping state.

As the locking portion 20 moves from the fixing state to the stopping state, the elastic body 23 is stretched, and the first inclined plane 221 of the hook portion 22 pushes against the second inclined plane 122a of the stopping latch 122. The first inclined plane 221 causes the hook portion 22 to stop the stopping portion 12, and the stopping arm 121 moves away from the locking portion 20. Before the stopping state is reached, the hook portion 22 does not interfere with the stopping portion 12, and the stopping arm 121 returns to its resting position.

Figure 8:
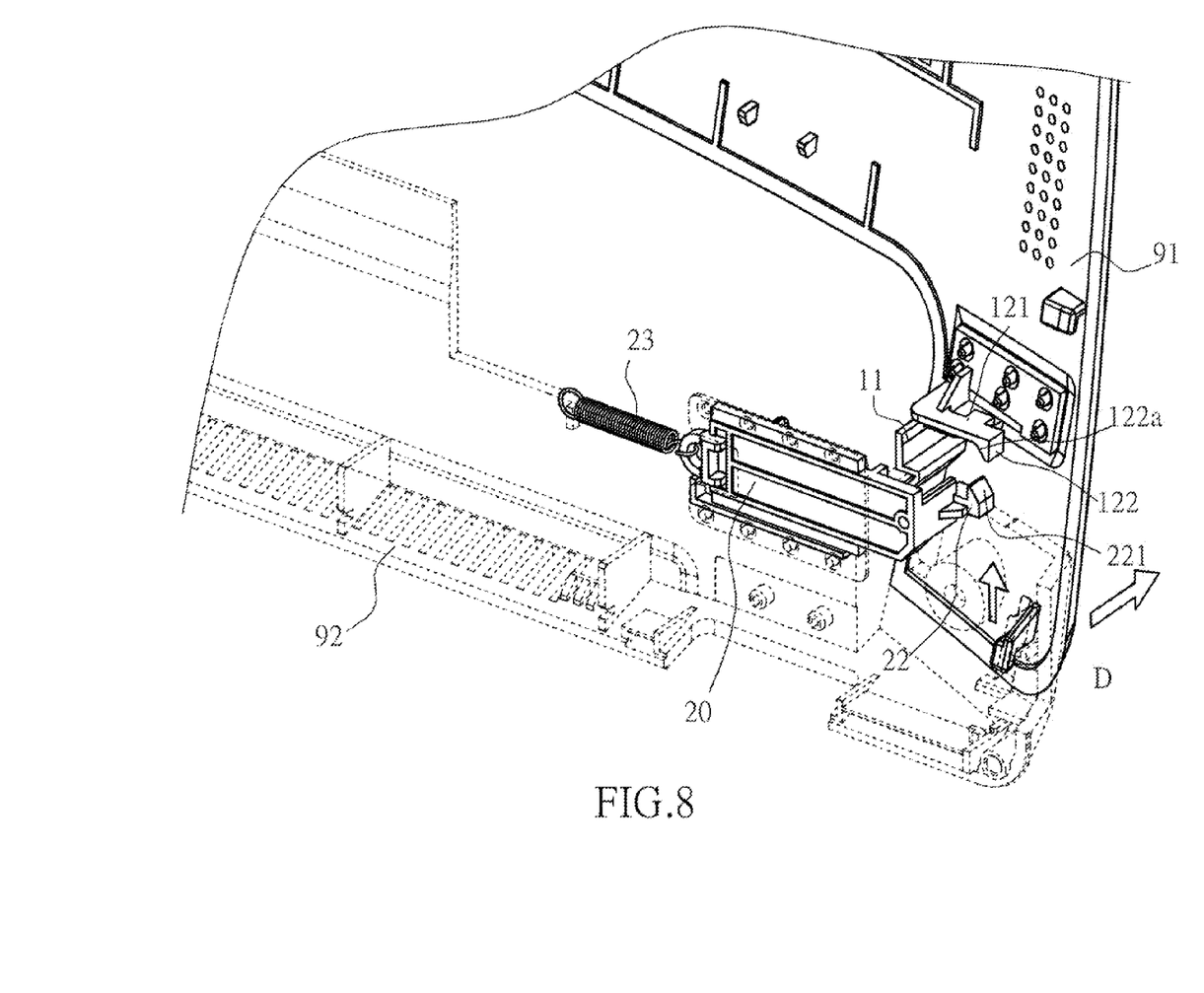
FIG. 8 is a composing diagram of the assembly structure of present invention in separating state.
Figure 9:
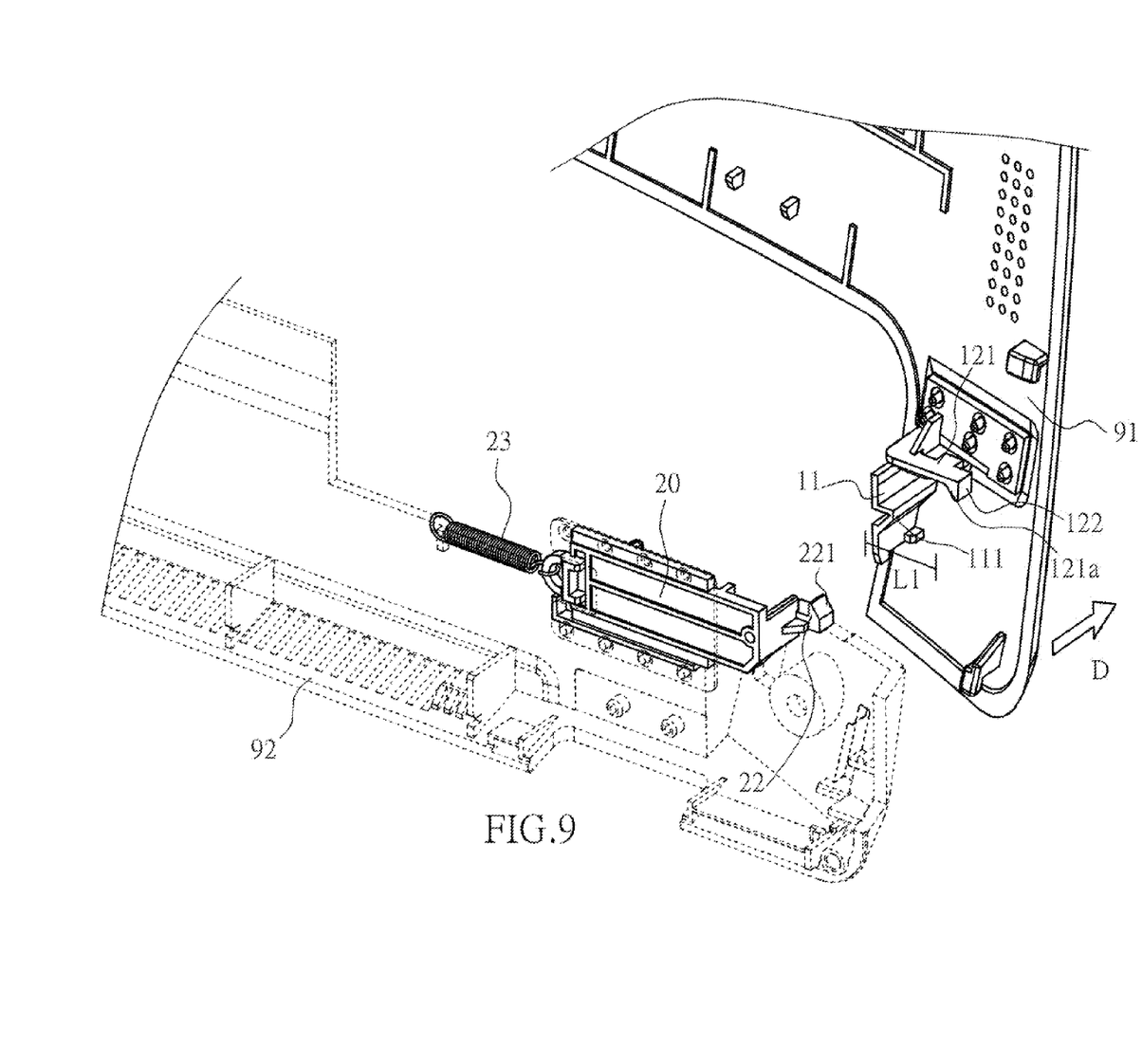
FIG. 9 is a composing diagram of the assembly structure of present invention in separating state.

As described above, in the stopping state, the fixing part 11 and the locking part 21 are separated, and the first housing 91 and the second housing 92 are separated along the assembly direction D; the assembly direction D and the moving direction M are not parallel. In one embodiment of the present invention, the assembly direction D is perpendicular to the moving direction M. As shown in FIG. 8 and FIG. 9, the fixing part 11 and the locking part 21 are in a separated state, and the first housing 91 and the second housing 92 are also in a separated state. The tensile energy of the elastic body 23 causes the locking part 21 to return to the position in the fixing state or the position in which the elastic body 23 is not stretched.

Figure 10:
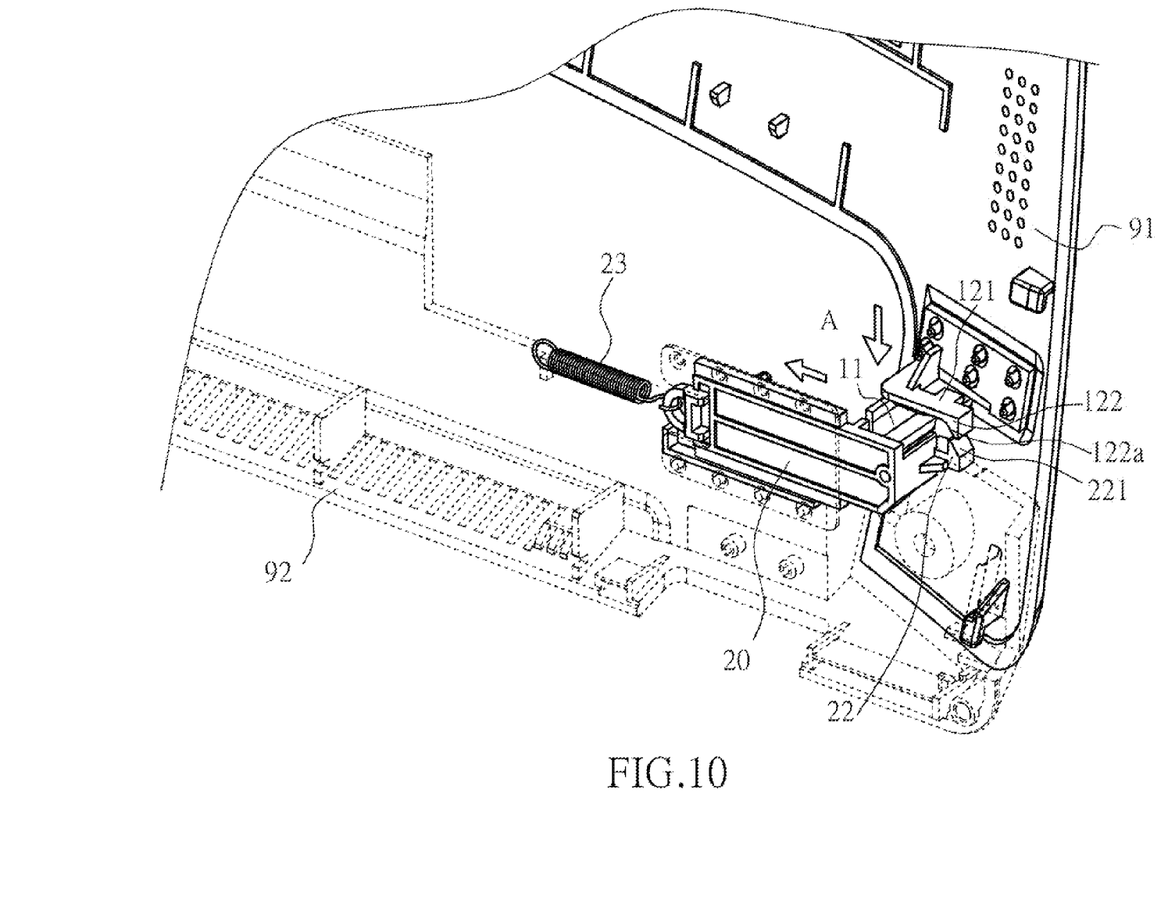
FIG. 10 is a composing diagram of the assembly structure of present invention in installing state.

As shown in FIG. 2, FIG. 3 and FIG. 10, the fixing portion 10 and the locking portion 20 are in the installation state; the first housing 91 is disposed on the second housing 92. The fixing portion 10 is close to the locking portion 20 along an installation direction, and the fixing slope 111 interferes with the lock slope 211. In the installation process, the fixing slope 111 pushes the lock slope 211 and causes the locking portion 20 to move to the stopping latch 122 along the moving direction M.

For clarity, the projection length of the movement of the lock slope 211 (fixing slope 111) in the moving direction M is defined as an installation stroke. The length between the hook portion 22 in the stopping state and the fixing state is a disassembly stroke. The installation stroke is smaller than the disassembly stroke. That is, in the installation state, the moving stroke of the hook portion 22 is the installation stroke, and therefore the hook portion 22 is not in contact with the stopping latch 122. After the installation state, the assembly structure 1 returns to the fixing state.

As described above, the user pushes against the toggle portion 24, and therefore the locking portion 20 and the fixing portion 10 are in the stopping state. When the hook portion 22 is in contact with the stopping latch 122, thus the locking portion 20 cannot be pulled back by the elastic body 23 to the fixing state. Because the stopping latch 122 stops the hook portion 22, the user can separate the first housing 91 and the second housing 92 along the assembly direction without applying force to the toggle portion 24; therefore, the user can separate the first housing 91 and the second housing 92 in two steps: forcing the second housing 92 along the moving direction, and then along the assembly direction.

As shown in FIG. 1 and FIG. 4, in one embodiment of the present invention, the electronic device 9 comprises a pair of assembly structures 1, the two moving directions M of the two assembly structures 1 are opposite, and in the transition from the fixing state to stopping state, the locking portion 20 moves outward. This method provides ergonomic operation. The assembly structure 1 can be modified according to different design needs of the electronic device 9 and is not limited by the above description.

As described above, the assembly structure of the present invention comprises the following advantages: When the hook portion contacts the stopping portion, the locking part remains in the locked state; when the locking part and the fixing part are separated, the fixing part can be separated from the locking part along the assembly direction.

With the design of the present invention, typical memory cards can be integrated with the storage device of the computer to expand the storage space of the computer, and the application software can perform file management in the computer storage space. When the storage space of the original memory card is insufficient, the method of the present invention can be used for upgrading the original memory card to another memory card with a larger storage space for convenience.

Although the present invention has been explained in relation to its preferred embodiment, it is also of vital importance to acknowledge that many other possible modifications and variations can be made without departing from the spirit and scope of the invention as hereinafter claimed.

What is claimed is:

1. An assembly structure, for installing a first housing and a second housing, the assembly structure comprising:
a fixing portion, set in a first housing, the fixing portion comprising a fixing part and a stopping portion; and
a locking portion, setting in a second housing, the locking portion having a moving direction relative to the second housing, the locking portion comprising a locking part and a hook portion;
wherein, the assembly structure comprises a fixing state and a stopping state; in the fixing state, the locking part is connected to the fixing part, the locking portion moving along the moving direction for switching the assembly structure into the stopping state; in the stopping state, the hook portion leans against the stopping portion, and the locking part and the fixing part are separated such that the fixing portion can be separated from the locking portion along an assembly direction, the assembly direction and the moving direction not being different.

2. The assembly structure as claimed in 1, wherein the locking portion further comprises an elastic body, and a stretching direction of the elastic body corresponds to the moving direction.

3. The assembly structure as claimed in claim 2, wherein the stopping portion comprises a stopping arm and a stopping latch; the stopping arm comprises a free end and a fixing end, the fixing end is fixed on the first housing, the stopping latch is disposed on the fixing end of the stopping latch, and the stopping arm is substantially parallel to the moving direction.

4. The assembly structure as claimed in 3, wherein the distance between the fixing part and the fixing latch is a fixing length, the distance between the hook portion and the locking part is a locking length, and the fixing length is greater than the locking length; in the stopping state, the fixing part and the locking part are separate.

5. The assembly structure as claimed in 4, wherein the hook portion comprises a first inclined plane and the stopping latch comprises a second inclined plane; the first inclined plane of the hook portion is corresponding to the second inclined plane of the stopping latch.

6. The assembly structure as claimed in 5, wherein the assembly direction and the moving direction are substantially perpendicular.

7. The assembly structure as claimed in 6, wherein the fixing part comprises a fixing slope, the locking part comprises a lock slope, and the fixing slope is corresponding to the lock slope.

8. The assembly structure as claimed in 7, wherein the projection length of the locking length in the moving direction is defined as an installation stroke, and the length between the hook portion in the stopping state and the hook portion in the fixing state is an assembly stroke, the installation stroke being smaller than the assembly stroke.

9. The assembly structure as claimed in 6, wherein the locking portion further comprises a toggle portion, and the toggle portion extends to the fixing portion.

10. An electronic device, comprising:
a first housing, comprising a fixing portion, the fixing portion comprising a fixing part and a stopping portion;
a second housing, comprising a locking portion, the locking portion having a moving direction relative to the second housing, the locking portion comprising a locking part and a hook portion;
wherein, the electronic device comprises a fixing state and a stopping state; in the fixing state, the locking part is connected to the fixing part, the locking portion moving along the moving direction for switching the electronic device into the stopping state; in the stopping state, the hook portion leans against the stopping portion, and the locking part and the fixing part are separated such that the first housing can be separated from the second housing along an assembly direction, the assembly direction and the moving direction being different.

11. The electronic device as claimed in 10, wherein the first housing has a pair of the fixing portions, the second housing has a pair of the locking portions, the pair of the fixing portions are corresponding to the pair of the locking portions, the moving directions of the pair of the locking portions are opposite.

12. The electronic device as claimed in 11, wherein the first housing has an installation hole, the fixing portion set through the installation hole.

13. The electronic device as claimed in 12, wherein the locking portion further comprises an elastic body, and a stretching direction of the elastic body corresponds to the moving direction.

14. The electronic device as claimed in claim 13, wherein the stopping portion comprises a stopping arm and a stopping latch; the stopping arm comprises a free end and a fixing end, the fixing end is fixed on the first housing, the stopping latch is disposed on the fixing end of the stopping latch, and the stopping arm is substantially parallel to the moving direction.

15. The electronic device as claimed in 14, wherein the distance between the fixing part and the fixing latch is a fixing length, the distance between the hook portion and the locking part is a locking length, and the fixing length is greater than the locking length; in the stopping state, the fixing part and the locking part are separate.

16. The electronic device as claimed in 15, wherein the hook portion comprises a first inclined plane and the stopping latch comprises a second inclined plane; the first inclined plane of the hook portion is corresponding to the second inclined plane of the stopping latch.

17. The electronic device as claimed in 16, wherein the assembly direction and the moving direction are substantially perpendicular.

18. The electronic device as claimed in 17, wherein the fixing part comprises a fixing slope, the locking part comprises a lock slope, and the fixing slope is corresponding to the lock slope.

19. The electronic device as claimed in 18, wherein the projection length of the locking length in the moving direction is defined as an installation stroke, and the length between the hook portion in the stopping state and the hook portion in the fixing state is an assembly stroke, the installation stroke being smaller than the assembly stroke.

20. The electronic device as claimed in 19, wherein the locking portion further comprises a toggle portion, and the toggle portion extends to the fixing portion, the second housing is set an operation hole, the toggle portion is set through the operation hole.

* * * * *